United States Patent
Masuda et al.

(10) Patent No.: US 7,485,347 B2
(45) Date of Patent: Feb. 3, 2009

(54) METHOD OF FORMING A FILM WITH LINEAR DROPLETS AND AN APPLIED TEMPERATURE GRADIENT

(75) Inventors: Takashi Masuda, Suwa (JP); Masayoshi Todorokihara, Fujimi-machi (JP)

(73) Assignee: Seiko Epson Corporation, Tokyo (JP)

( * ) Notice: Subject to any disclaimer, the term of this patent is extended or adjusted under 35 U.S.C. 154(b) by 481 days.

(21) Appl. No.: 10/959,998

(22) Filed: Oct. 8, 2004

(65) Prior Publication Data
US 2005/0112294 A1    May 26, 2005

(30) Foreign Application Priority Data
Nov. 25, 2003    (JP)    ............... 2003-393781

(51) Int. Cl.
    *B05D 1/40*    (2006.01)
(52) U.S. Cl. ........................ 427/466; 427/256
(58) Field of Classification Search ............ 427/466, 427/256
    See application file for complete search history.

(56) References Cited

U.S. PATENT DOCUMENTS

| | | | |
|---|---|---|---|
| 5,132,248 A | | 7/1992 | Drummond et al. |
| 6,221,438 B1 * | | 4/2001 | Matthies ............ 427/466 |
| 6,506,453 B2 | | 1/2003 | Ema et al. |
| 6,599,582 B2 * | | 7/2003 | Kiguchi et al. ........... 427/466 |
| 6,719,844 B2 | | 4/2004 | Ema et al. |
| 2004/0089229 A1 | | 5/2004 | Ema et al. |

FOREIGN PATENT DOCUMENTS

| | | |
|---|---|---|
| JP | A 59-75205 | 4/1984 |
| JP | A 2001-170546 | 6/2001 |
| JP | A 2003-033713 | 2/2003 |
| WO | WO 02/073712 AI | 9/2002 |

* cited by examiner

*Primary Examiner*—Frederick J Parker
(74) *Attorney, Agent, or Firm*—Oliff & Berridge, PLC (57) ABSTRACT

Provided is a method for forming a film by which a highly accurate film pattern can easily be formed out of droplets. The method includes forming linear droplets on a surface of a substrate, providing a temperature gradient onto surfaces of the linear droplets, and forming a dry film including a straight part at an end section of the linear droplets. In order to provide a temperature gradient onto surfaces of the linear droplets, the substrate, on which the droplet is sprayed, is bridged between a hot plate and cooling plate.

9 Claims, 9 Drawing Sheets

METHOD OF FORMING A FILM WITH LINEAR DROPLETS AND AN APPLIED TEMPERATURE GRADIENT

BACKGROUND OF THE INVENTION

1. Field of Invention

Aspects of the invention can relate to a method of forming a film, a method of manufacturing a device, and an electro-optical apparatus.

2. Description of Related Art

A patterning method that makes use of a related art inkjet method includes directly applying a liquid material containing a fine particle dispersed in it as a pattern onto a substrate by inkjet method, and then converting the applied liquid material into a conductive film pattern by subsequent thermal treatment and/or applying laser, as described in U.S. Pat. No. 5,132,248. Putting this related art method into practice enables pattern forming without using photolithography technique, and also makes it possible to simplify the pattern forming process. Furthermore, this method can have an advantage of lessening the amount of raw material to be used.

Moreover, as a patterning method by making use of a related art ink-jet method there is another method, in which a position of a droplet to be ejected is controlled by placement of a bank onto a substrate in order to improve pattern forming accuracy, as described in Japanese Unexamined Patent Publication No. 59-75205. If, once the bank is formed, there is no chance that the droplet ejected onto the substrate goes over the bank. As a result, for example, a film pattern of about 30 microns in width can be formed with positioning accuracy of about 1 micron.

In addition to the related art patterning methods described above, there is also another method proposed, in which a liquid material is selectively applied only onto a liquid-affinitive part of a substrate on which a pattern of a liquid-repellent or liquid-affinitive part has been formed with an organic molecular film, and then the applied liquid material is converted into a conductive film pattern by subsequent thermal treatment. According to this method, the conductive film pattern can be formed with good accuracy through a simple process.

SUMMARY OF THE INVENTION

As devices are downsized more and more, more minute patterns have become more desirable.

However, in the patterning method described in U.S. Pat. No. 5,132,248, the width of a formed line is dependent on the size of droplets ejected, and therefore, it is needed to make the size of droplets smaller for thinning the line width. But there exists a limit on making the size of droplets smaller because of restriction on the size of the ink-jet nozzle diameter. Eventually, under such conditions, the ultimate positioning accuracy is about 30 microns in forming a pattern of about 100 microns in width. Meanwhile, in the pattering method describe in Japanese Unexamined Patent Publication No. 59-75205, the bank on the substrate is formed by using photolithography technique, and therefore, a problem is that the production cost becomes high. Moreover, in the method of forming a pattern of a liquid-repellent or liquid-affinitive part on a substrate with an organic molecular film; the thinnest line that can be formed is on the order of some tens of microns because of restriction on the size of the inkjet nozzle diameter.

Furthermore, there is another related art technique proposed in which a pattern, being finer in comparison with the size of droplets, is formed by making use of convection inside the droplets and gathering solid substances included in the droplets to outer sections of the droplets. In this method, the droplets are placed on a line, and a dry film is formed at each end section to eventually make two patterns along the longitudinal direction of the line. According to this method, it becomes possible to make the pattern finer in comparison with a related patterning method. However, when applying the method for manufacturing devices is considered, there are some problems still remaining; such as, two patterns are always formed, the space between the two patterns is dependent on the size of droplets, and so on.

Aspects of the invention can provide a method of forming a film by which one highly accurate film pattern can easily be formed out of one linear droplet.

Another aspect of the invention can provide a method of manufacturing a device that is downsized and excellent in displaying quality, being equipped with a highly accurate film pattern, and an electro-optical apparatus thereof.

An exemplary film forming method of the invention can be a method of forming a film, including a process step of forming linear droplets by placing a plurality of droplets onto a substrate, and a process step of forming a film pattern at a part of an end section of the linear droplets by providing surfaces of the linear droplets with a temperature gradient. Particularly, one end section of the linear droplets in a widthwise direction is provided with a temperature, the temperature being different from a temperature that the other end section of the linear droplets in the widthwise has, in order to form a film pattern at the end section with a lower temperature of the linear droplets.

If surfaces of the linear droplets are provided with a temperature gradient, a surface tension distribution develops on the surface to cause a thermal capillary flow, which causes Marangoni convection in the droplet. Under this condition, providing the surface of the droplet with an adequate temperature gradient provides for a thermal capillary flow. The thermal capillary flow comes out of the end section of the linear droplets with a higher, temperature and descends toward the substrate without reaching the end section having a lower temperature. As a result, a solid substance included in the droplet gets precipitated at the end section with a lower temperature, which is not included in a flow path of Marangoni convection. Then, the end section of the droplet becomes as if it is pinned with the precipitated solid substance (i.e., pinning) so that contraction of the droplet to be caused by subsequent drying is restrained. Meanwhile, a solid substance included in the droplet is transferred by the convection. The solid substance is not likely to get precipitated at the end section with a higher temperature, which is in the flow route of Marangoni convection, once the droplet gets contracted through a drying process step (de-pinning). As a result, the solid substance is precipitated only at a part of the end section of the linear droplets to form a film pattern. Therefore, it becomes possible to form a highly accurate film pattern by using an ordinary-use droplet ejection device that ejects ordinary-size droplets.

Furthermore, it is preferable that the substrate, on which the linear droplets are formed, is laid between a first heat supply section that provides one end section of the linear droplets with a first temperature, and a second heat supply section that provides the other end section of the linear droplets with a temperature, the temperature being different from the first temperature, so that surfaces of the linear droplets are provided with a temperature gradient. According to this setup, it becomes possible to easily provide the surface of the linear droplets with a temperature gradient via the substrate.

Moreover, it may also be possible that surfaces of the linear droplets are provided with a temperature gradient by applying light rays to one end section of the linear droplets in a widthwise direction or to the substrate. According to this setup as well, it becomes possible to provide the surface of the linear droplets with a temperature gradient.

Still further, it is preferable that a static contact angle between the substrate, on which the droplet is placed, and the droplet is in the range from 20 degrees to 50 degrees. If the contact angle between the droplet and the substrate is too great, the droplet tends to contract like a ball due to effect of surface tension and a bulge (swell) is formed at an end section, etc., of the droplet so that it becomes difficult to form a required film pattern. To the contrary, if the contact angle between the droplet and the substrate is too small, the droplet spreads in wet condition in a wide area so that it becomes difficult to form a highly accurate film pattern. Furthermore, since the droplet excessively spread in wet condition, it becomes difficult to cause convection effectively. Thus, having a contact angle in the range from 20 degrees to 50 degrees enables forming a highly accurate film pattern as specified. On this occasion, the static contact angle $\theta$ can be expressed with a formula:

$$\cos\theta = (\gamma_S - \gamma_{SL})/\gamma_L$$

(wherein, $\gamma_S$: Surface free energy of the substrate, $\gamma_L$: Surface free energy of the droplet, and $\gamma_{SL}$: Interfacial free energy between the substrate and the liquid). Namely, under a condition where a droplet remains stationary in an equilibrium state on a surface of a solid, the static contact angle is the angle caused between the liquid and solid.

Moreover, it is preferable that a receding contact angle between the substrate, on which the linear droplets are formed, and the droplets is set to be less than an angle caused by an end section of the droplets and the substrate at the time when a solid substance included in the droplets is precipitated at an end section of the droplets.

Each droplet starts to vaporize as soon as it gets ejected. Therefore, if the droplet starts to contract before precipitation of the solid substance, it becomes difficult to form a film pattern at a position as specified. From this viewpoint, if the setup is made as described above, the angle caused by the end section of the droplet and the substrate is greater than the receding contact angle before the solid substance starts to precipitate at the end section with a lower temperature of the linear droplets, and eventually there is no chance of contraction of the droplet. Furthermore, if once the solid substance precipitates at the end section with a lower temperature of the droplet, the end section of the droplet becomes as if it is pinned with the precipitated solid substance so that contraction of the droplet to be caused by subsequent drying is restrained. As a result, it becomes possible to precipitate the solid substance at a position as specified and form a highly accurate film pattern at the position as specified.

Moreover, it is preferable that the linear droplets are formed in plural numbers and surfaces of the plurality of the linear droplets are provided with a temperature gradient in order to form a film pattern at each of the end sections with a lower temperature of the plurality of the linear droplets collectively. According to this setup, a plurality of film patterns can be formed collectively so that the production cost can be reduced. Furthermore, since each of the linear droplets can be provided with a similar temperature gradient, each of the plurality of film patterns can be formed under similar condition.

Moreover, by providing surfaces of linear droplets with a temperature gradient to form a film pattern at a part of an end section of the linear droplets, a linear film pattern is formed. According to this forming step, the method can be applied into various fields, such as electrical wiring and so on. Furthermore, by shaping the droplet into any optional form, it is possible to form the film pattern having its form as required.

Meanwhile, an exemplary method of manufacturing a device of the invention can include manufacturing the device by making use of the method of forming a film described above. According to this setup, it becomes possible to manufacture a device equipped with a highly accurate film pattern and downsize the device.

Meanwhile, an electro-optical apparatus of the invention can include manufacturing the electro-optical apparatus by making use of the method of manufacturing a device described above. According to this setup, it becomes possible to provide an electro-optical apparatus that is downsized and excellent in displaying quality by furnishing a highly accurate film pattern.

BRIEF DESCRIPTION OF THE DRAWINGS

The invention will be described with reference to the accompanying drawings, wherein like numerals reference like elements, and wherein.

DETAILED DESCRIPTION OF PREFERRED EMBODIMENTS

The following sections explain an exemplary embodiment of the invention, while referring to drawings. Incidentally, in each of the drawings to be used for the following explanation, a magnifying scale for each component is appropriately changed to show each component in recognizable size on the drawing.

Figure 1A:
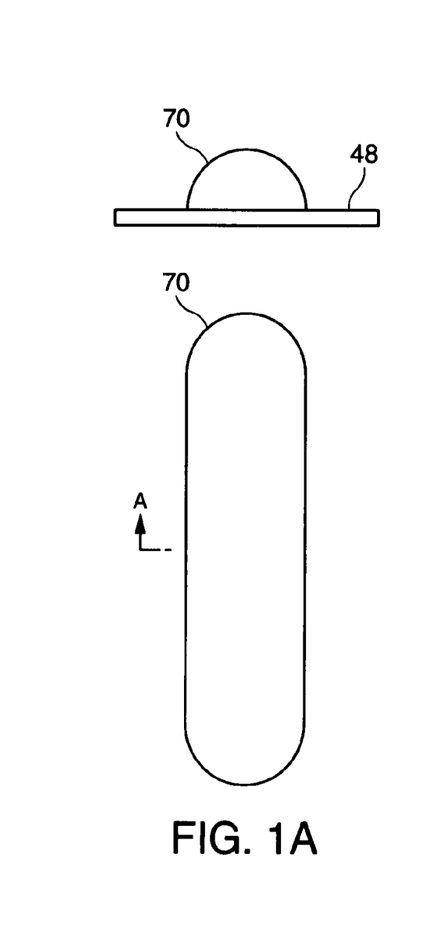
FIG. 1 shows drawings to explain a method of the embodiment of forming a film.
Figure 1B:
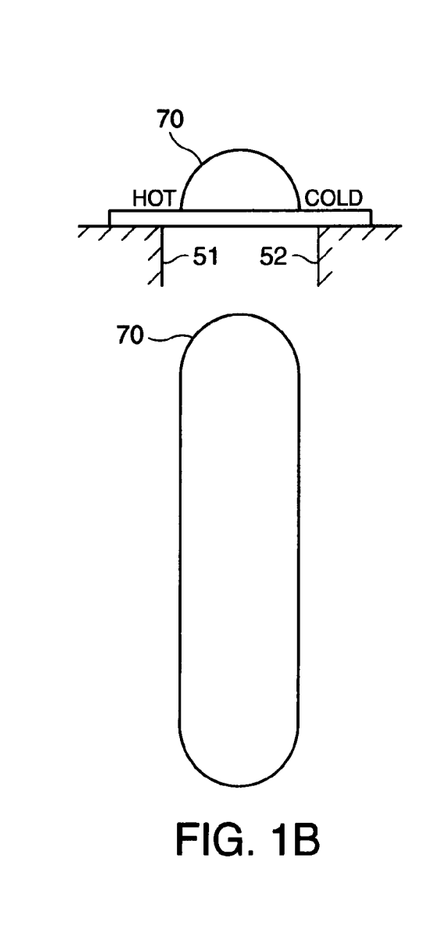
Figure 1C:
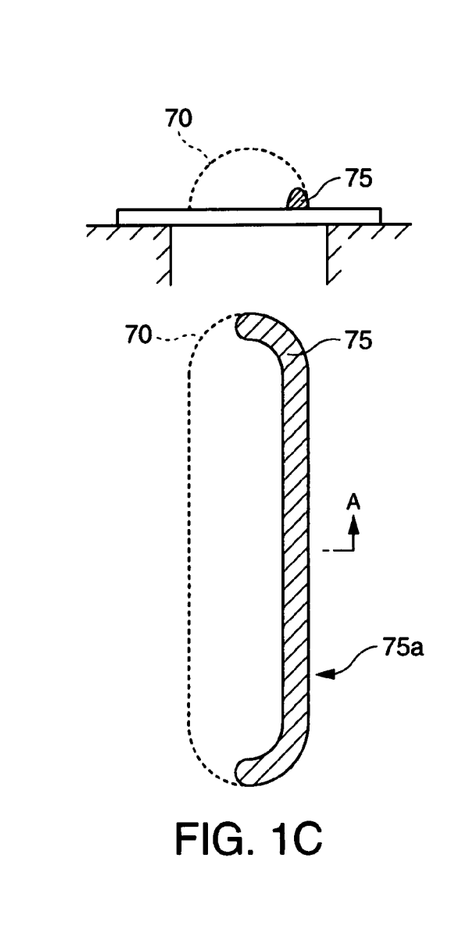

FIG. 1 shows drawings for explaining a method of forming a film of the present invention. Then, the drawings at the bottom side of FIG. 1A through FIG. 1C are plane views of a droplet and a dry film, while the drawings at the upper side of FIG. 1A through FIG. 1C are side-sectional views in the section 'A-A' of their corresponding drawings at the bottom side. The method of forming a film of the present invention comprises: a process of forming linear droplets 70 on a substrate 48 (droplet ejection process) as FIG. 1A shows, a process of providing a temperature gradient onto a surface of the formed linear droplet 70 (temperature gradient provision process) as FIG. 1B shows, and a process of forming a dry film 75 at an end section with a lower temperature of the linear droplets 70 (pinning process) as FIG. 1C shows. Then, a straight part 75*a* of the formed dry film 75 can be used as a fine electrical wiring pattern and so on. Each of the processes described above is explained below in due order.

At first, the linear droplets 70 are formed on the substrate 48 as shown in FIG. 1A (droplet ejection process). Specifically, a dispersion liquid of a forming material for a dry film is prepared, and then the dispersion liquid is ejected onto the substrate 48 by using a droplet ejection device, which is described later, to form the linear droplets 70. Incidentally, in the case where electrical wiring is formed with dry film, a conductive particle (Ag colloid ink, for example) is adopted as a dispersed substance. Moreover, an organic dispersion solvent, such as Tetra-decane, can be adopted as a dispersion solvent.

Figure 2A:
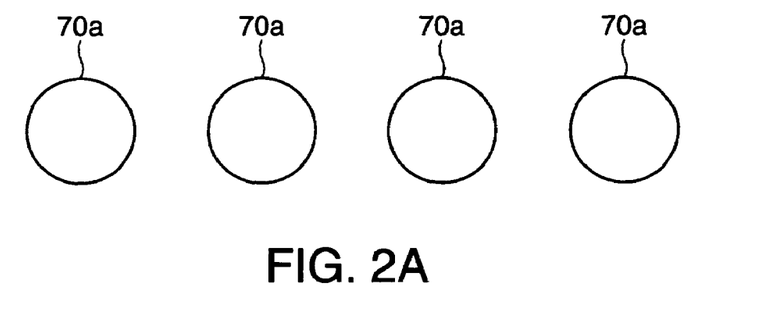
FIG. 2 shows drawings to explain a droplet ejection process.
Figure 2B:
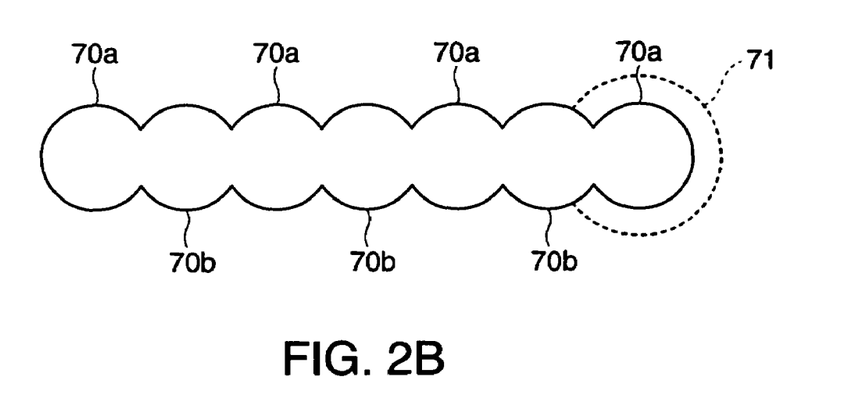
Figure 2C:
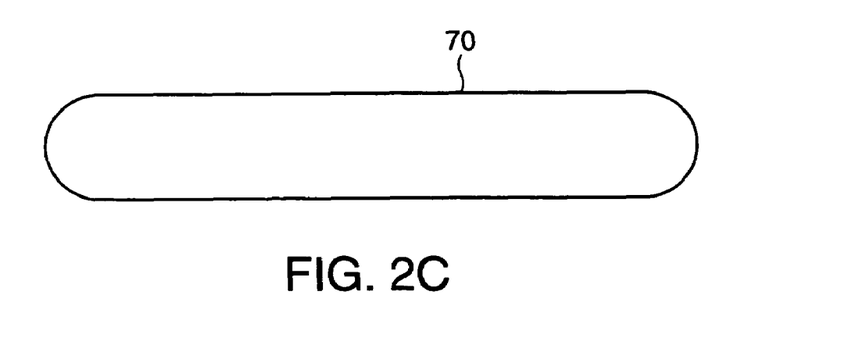

FIG. 2 shows drawings for explaining the droplet ejection process. In this exemplary embodiment, since a dry film including a straight part is formed, the droplet 70 is formed to be linear. In this case, as FIG. 2A shows, pluralities of dome-shaped fine droplets 70*a* are placed at regular intervals as specified. Next, as FIG. 2B shows, a plurality of second fine droplets 70*b* are placed so that each of the second fine droplets overlaps edge parts of the neighboring fine droplets 70*a*. Then, as FIG. 2C shows, each of the fine droplets 70*a* and 70*b* spreads in wet condition to form the linear droplets 70. Still further, the droplets 70*a* may also be placed at short intervals as specified so as to make edge parts of the droplets 70*a* overlap each other, and form a shape, in which the droplets become continuous even in initial condition as FIG. 2B shows. Thus, as FIG. 2C shows, each of the fine droplets 70*a* spreads in wet condition to form the linear droplets 70. In this case, as a matter of course, it is not needed to place the second fine droplets 70*b*.

Incidentally in FIG. 2B, if a contact angle between the fine droplets 70*a* and 70*b* and the substrate is too great, each of the fine droplets tends to contract like a ball due to effect of surface tension so that a liquid, which the fine droplets are composed of, may easily move inside the line and has a chance to form a bulge (swell) 71 at an end section, etc., of the line. In this case, it becomes impossible to obtain a dry film having a specified shape. To the contrary, if the contact angle between the fine droplets 70*a* and 70*b* and the substrate is too small, the droplet spreads in wet condition in a wide area so that it becomes impossible to obtain a highly accurate dry film.

Therefore, it is preferable that a static contact angle between the fine droplets 70*a* and 70*b* and the substrate is in the range from 20 degrees to 50 degrees, and further preferably in the range from 30 degrees to 40 degrees. This setup described above can prevent or reduce any such a bulge 71 from emerging, and then it becomes possible to avoid any excessive spreading of the droplet in wet condition so that a highly accurate dry film having a specified shape can be obtained. Furthermore, the contact angle can be adjusted by surface treatment for the substrate with a self assembled mono-layer film (SAM film). It is preferable that, for example, FAS17 (1H,1H,2H,2H-perfluoro-decyltriethoxy-silane) and so on is adopted as a self assembled mono-layer film.

If once the droplet 70 is ejected onto the substrate 48, the dispersion solvent included in the droplet starts and proceeds with vaporization. Due to the heat of vaporization incident to the vaporization of the dispersion solvent, there comes up a spontaneous temperature gradient on the surface of the droplet.

Figure 3A:
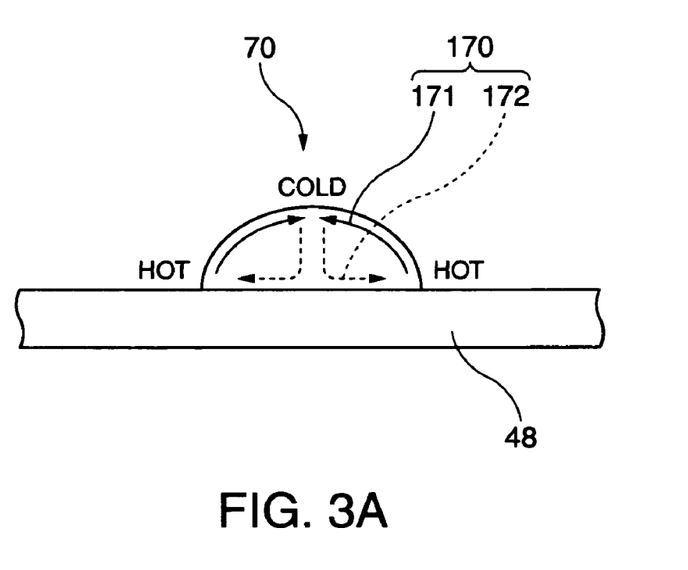
FIG. 3 shows drawings to explain Marangoni convection caused by a spontaneous temperature gradient.
Figure 3B:
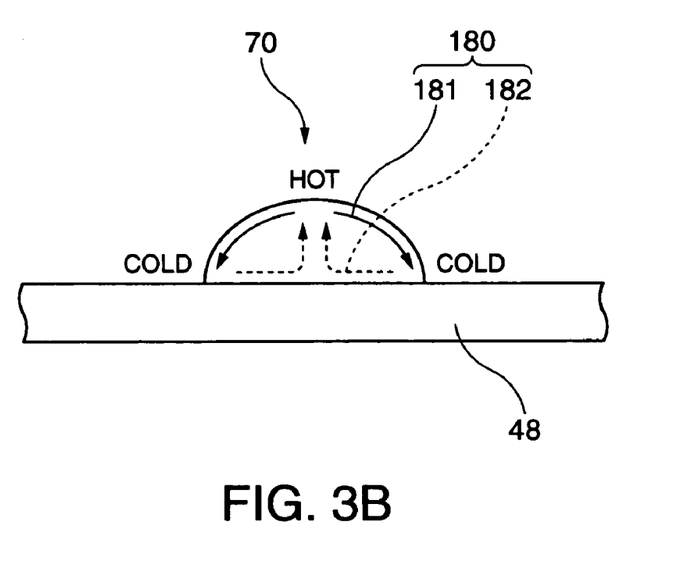

FIG. 3 shows drawings for explaining the spontaneous temperature gradient on the surface of the droplet, and Marangoni convection inside the droplet. On the surface of the droplet, depending on a boiling point of the dispersion solvent of the droplet, a few different temperature gradients arise. If the dispersion solvent is provided with a lower boiling point, the top part in the droplet 70 has a lower temperature than its edge part does, as FIG. 3A shows. It is considered that this phenomenon comes up because the dispersion solvent with a lower boiling point has a fast drying speed, and therefore, vaporization keeps on going before heat from the substrate reaches the top part in the droplet. To the contrary, if the dispersion solvent is provided with a higher boiling point, the temperature of the droplet is almost equalized inside the droplet or the edge part in the droplet has a lower temperature than its top part does, as FIG. 3B shows. It is considered that this phenomenon comes up because the dispersion solvent with a higher boiling point has a low drying speed, and therefore, heat from the substrate is more than enough to reach the top part of the droplet, and meanwhile the edge part of the droplet has a higher vaporization rate than the top part of the droplet does.

Owing to the spontaneous temperature gradient on the surface of the droplet, Marangoni convection is caused in the droplet. Then, Marangoni convection is described below.

Generally speaking, when there arises a temperature gradient in a liquid layer, Rayleigh convection and/or Marangoni convection is caused. Rayleigh convection is generated because of density difference incident to temperature difference, and the deeper the depth of the liquid layer is, the more dominant Rayleigh convection becomes. Meanwhile, Marangoni convection is generated because of surface tension difference incident to temperature difference, and the shallower the depth of the liquid layer is, the more dominant Marangoni convection becomes. The droplet ejection device to be used in this exemplary embodiment, such as an inkjet unit, ejects sufficiently small droplets in their size, and eventually Marangoni convection becomes dominant. Therefore, in this exemplary embodiment, a precipitation position of a solid substance in the droplet is controlled by making use of Marangoni convection.

Incidentally, a flow caused by a temperature gradient in the direction perpendicular to a gas-versus-liquid interface is called Marangoni convection in a narrow sense, while a flow caused by a temperature gradient in the direction parallel with a gas-versus-liquid interface is called a thermal capillary flow. By the way, the higher the liquid surface temperature is, the less the surface tension becomes, and the lower the liquid surface temperature is, the more the surface tension becomes. Then, a liquid is pulled from an area with less surface tension toward an area with more surface tension to make a flow, and therefore, a thermal capillary flow is eventually caused from an area with higher temperature toward an area with lower temperature. Furthermore, regardless of the position of the temperature gradient region, a thermal capillary flow is caused if there only exists a temperature gradient on the liquid surface.

Thus, if there is caused a spontaneous temperature gradient on the liquid surface, a thermal capillary flow comes up along the liquid surface. Then, in accordance with such movement, there is generated Marangoni convection inside the droplet. If the dispersion solvent is provided with a lower boiling point, the top part in the droplet 70 has a lower temperature than its edge part does, as FIG. 3A shows. Therefore, a thermal capillary flow 171 is generated, streaming from the edge part of the droplet toward the top part, and accordingly, Marangoni convection 170 arises in the droplet. To the contrary, if the dispersion solvent is provided with a higher boiling point, the edge part in the droplet has a lower temperature than its top part does, as FIG. 3B shows. Therefore, a thermal capillary flow 181 is generated, streaming from the top part of the droplet toward the edge part, and accordingly, Marangoni convection 180 arises in the droplet.

Furthermore, through an experiment conducted by the inventor; it is already recognized that the temperature distribution and Marangoni convection shown in FIG. 3A are caused if a lower-boiling-point dispersion solvent having its boiling point lower than 150 degrees Celsius. Then, it is recognized that the temperature distribution and Marangoni convection shown in FIG. 3B are caused if a higher-boiling-point dispersion solvent having its boiling point higher than 150 degrees Celsius is used. However, it is also recognized that there exist some movement systems in which the temperature gradient becomes less by degrees as the vaporization progresses, though a higher-boiling-point dispersion solvent is used, and eventually Marangoni convection stops. Furthermore, it is also recognized that there are some dispersion solvents in which a spontaneous temperature gradient does not necessarily happen so much on the droplet surface, and Marangoni convection does not happen inside the droplet. Those dispersion solvents are initially provided with such a characteristic that a temperature gradient is hardly caused, for example, being provided with a great specific heat.

Figure 4A:
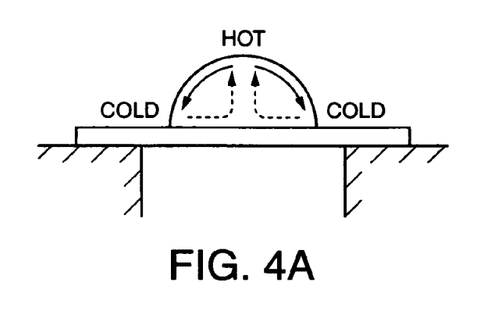
FIG. 4 shows drawings to explain Marangoni convection caused by a compulsory temperature gradient.

FIG. 4 shows drawings for explaining the temperature gradient on the surface of the droplet, and Marangoni convection inside the droplet, in each process step of this embodiment. Since Tetra-decane having a high boiling point (boiling point: 254 degrees Celsius) is used as a dispersion solvent in this embodiment, a spontaneous temperature gradient and Marangoni convection are caused as FIG. 4A shows. Incidentally, in any case of using a dispersion solvent having any boiling point, providing a compulsory temperature gradient as described below makes it possible to cause Marangoni convection according to the compulsory temperature gradient.

Figure 4B:
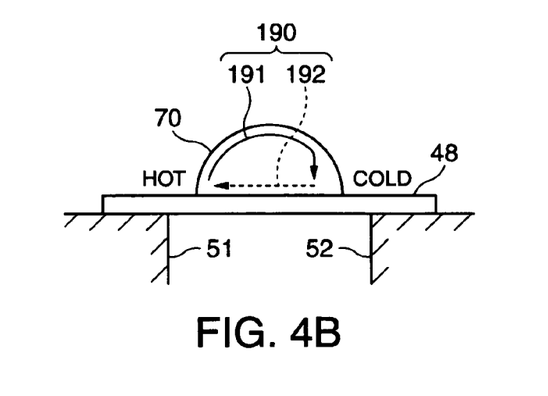

Next, a compulsory temperature gradient is provided for a surface of the formed linear droplet 70, as FIG. 1B shows. Here, a temperature gradient is provided in such a manner that the temperature on the surface of the droplet increases or decreases in the widthwise direction from one end section to the other in the linear droplets 70, as FIG. 4B shows. In other words, a temperature gradient is provided in such a manner that one end section of the linear droplets 70 in the widthwise direction has a higher or lower temperature than the other end section does. To provide such a temperature gradient, a first heat supply section that provides one end section of the linear droplets 70 with a first temperature, and a second heat supply section that provides the other end section with a second temperature, which is lower than the a first temperature, are used. Here, it is suggested that the substrate 48, having the linear droplets 70 placed on it, is laid between a hot plate 51 (first heat supply section) for providing one end section of the linear droplets 70 with a specified temperature and a cooling plate 52 (second heat supply section) for providing the other end section of the linear droplets 70 with a temperature lower than that of the hot plate 51 (to locate one end of the substrate 48 in the widthwise direction of the linear droplets 70 onto the hot plate 51 and the other end of the substrate 48 onto the cooling plate 52) to place the linear droplets 70 between the hot plate 51 and the cooling plate 52. Furthermore, it is still possible that the entire linear droplet 70 is not necessarily placed between the hot plate 51 and the cooling plate 52, but only one end section or the other end section of the linear droplets 70 is located above either of the hot plate 51 and the cooling plate 52, or one end section of the linear droplets 70 is located above the hot plate 51 and the other end section is located above the cooling plate 52. In this case, the surface of the linear droplets 70 can be provided with a temperature gradient easily and uniformly through the substrate 48.

Moreover, it is preferable that the substrate 48 has high thermal conductivity. It is because the droplet surface can be provided with a temperature gradient as required if the substrate 48 has high thermal conductivity, even though only a slight temperature difference is given between the hot plate 51 and the cooling plate 52. Furthermore, it is still possible to provide the droplet surface with a temperature gradient as required by having a substantial temperature difference between the hot plate 51 and the cooling plate 52 even if the substrate 48 has low thermal conductivity. Meanwhile, it is also possible to provide the surface of the linear droplets with a temperature gradient by applying a beam of light, such as laser, onto an end section of the higher temperature side of the linear droplets 70 or a specified position in the substrate for providing the end section of the higher temperature side of the linear droplets 70 with temperature as required; i.e., it is a part of the substrate 48 at the side of the end section of the higher temperature side in the widthwise direction of the linear droplets 70.

If a compulsory temperature gradient is given to surfaces of the linear droplets as FIG. 4B shows, a thermal capillary flow 191 is generated in the direction from the end section of the higher temperature side toward the end section of the lower temperature side of the linear droplets 70. In accordance with the movement, a counter-direction flow 192 is caused on a surface of the substrate 48 so that Marangoni convection 190 is eventually generated inside the droplet 70. Through an experiment conducted by the inventor, it is already recognized that setting an appropriate temperature to be given to the droplet 70 enables making the thermal capillary flow 191, which comes out of the end section of the higher temperature side of the droplet 70, descend toward the substrate 48 without reaching the end section of the lower temperature side of the droplet 70 before the thermal capillary flow reaches the end section of the lower temperature side. It is considered that this phenomenon happens because the liquid movement gets some difficulties at a wedge-shaped droplet end, and the thermal capillary flow 191 descends along the droplet surface toward the end section of the lower temperature side so that the thermal capillary flow is likely to depart from the droplet surface before reaching the end section and to descend toward the substrate 48.

According to this movement, the liquid gets built up at the end section of the lower temperature side, which is not included in the flow path of Marangoni convection 190, once a dispersed substance is precipitated on the substrate 48. Therefore, the pinning operation, described below, tends to happen easily at the top end section of the lower temperature side. Meanwhile, at the top end section of the higher temperature side, which is included in the flow path of Marangoni convection 190, the dispersed substance is raked out by Marangoni convection so that it is not precipitated on the substrate. As a result, the de-pinning, operation tends to happen easily at the top end section of the higher temperature side as described below.

Next, the dry film 75 is formed at the end section of the lower temperature side of the linear droplets 70 as FIG. 1C shows. Forming the dry film 75 is carried out by pinning the end section of the lower temperature side of the linear droplets 70 and de-pinning the end section of the higher temperature side.

Figure 5A:
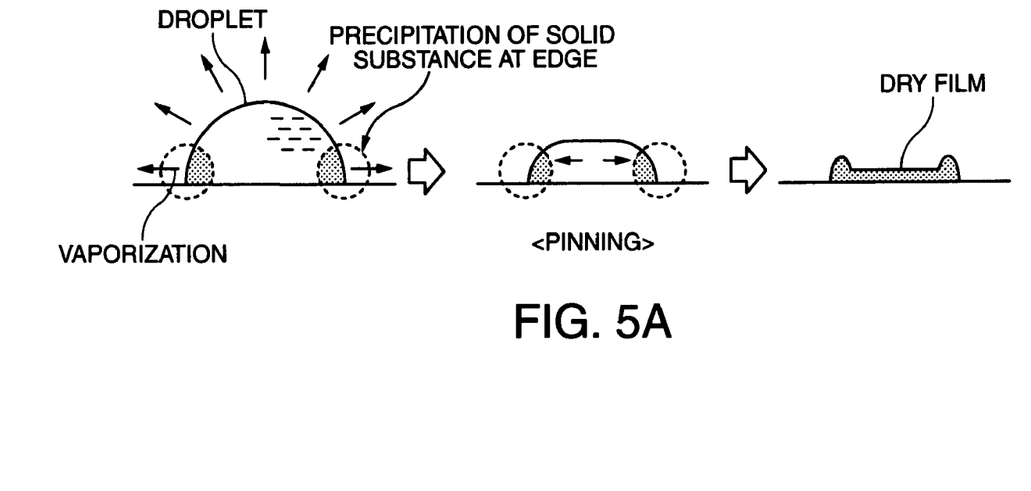
FIG. 5 shows drawings to graphically explain drying processes of typical droplets.
Figure 5B:
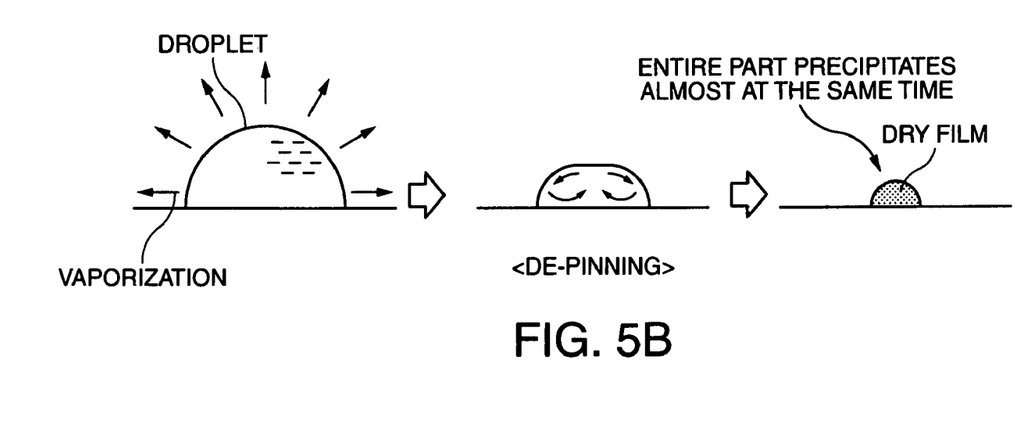

FIG. 5 shows drawings to graphically illustrate typical drying processes of droplets. Through drying processes of a droplet, a dry film of the droplet can be controlled so as to be formed into various shapes by using some factors as parameters, such as solid substance concentration of the liquid material, drying speed of the droplet, convection, particle size in the case of particles of solid substance, and so on. For example, the shape shown by FIG. 5A can be formed so as to have a film thickness of the circumferential area thicker than that of the center area, meanwhile the shape shown by FIG. 5B can be formed so as to be contracted in comparison with the droplet form that the droplet initially had just after its ejection. Incidentally, the flows inside the droplets, indicated with arrows in FIG. 5A and FIG. 5B, are just examples and they may be different from their actual condition.

FIG. 5A is a drawing that explains pinning operation. In the case of a droplet shaped like this one, drying operation generally progresses faster in the circumferential area of the droplet. Therefore, in an earlier drying stage, solid substance concentration tends to increase in the circumferential area of the droplet. If once the solid substance concentration in the circumferential area of the droplet reaches the saturation point, the solid substance gets precipitated locally in the circumferential area. Then, the circumferential area of the droplet becomes as if it is pinned with the precipitated solid substance so that contraction of the droplet (i.e., contraction of the circumference) to be caused by subsequent drying is restrained. In this specification, the phenomenon, i.e., in which contraction of the droplet to be caused by subsequent drying is restrained by the solid substance precipitated in the circumferential area, is called pinning. If once the pinning is caused, most solid substance is transferred to the circumferential area. Then, the solid substance mostly gets precipitated at the circumferential area so that a dry film, which is thicker in its thickness at the circumferential area than it is at the center area, can be obtained.

FIG. 5B is a drawing that explains de-pinning operation. In drying processes of a droplet, if no solid substance gets precipitated locally in the circumferential area of the droplet, the pinning operation described above does not happen and the entire part of the droplet is contracted through drying processes of the droplet to decrease the diameter of the droplet. The solid substance concentration in the droplet increases almost uniformly, and when the solid substance concentration reaches the saturation point, the solid substance gets precipitated almost at the same time. As a result, thickness of the thin film to be obtained is almost the same at the circumferential area and the center area, or thickness at the center area becomes somewhat thicker than thickness at the circumferential area. Hereinafter, this phenomenon, i.e., in which the droplet gets contracted without pinning at the time of drying, is called de-pinning. Through de-pinning operation, a dry film, which is contracted in its form in comparison with the droplet form that the droplet initially had just after its ejection, can be obtained.

As a general rule, a droplet placed on a substrate dries faster in the circumferential area (edge), and the solid substance concentration reaches the saturation point at first in the circumferential area. Therefore, a droplet placed on a substrate has pinning operation, as a general rule. Accordingly, for causing de-pinning operation of the droplet, it is needed to positively control various parameters, such as solid substance concentration of the liquid material, drying speed of the droplet, convection, particle size in the case of particles of solid substance, and so on.

On the other hand, in this embodiment; Marangoni convection 190 shown in FIG. 4B is caused inside the linear droplets 70, and therefore, pinning operation tends to happen easily at the end section of the lower temperature side, which is not included in a flow path of Marangoni convection 190, and de-pinning operation tends to happen easily at the end section of the high temperature side, which is included in the flow path of Marangoni convection 190. But then, as a general rule, any droplet on a substrate causes pinning operation in it. Therefore, for causing de-pinning operation at the end section of the higher temperature side of the linear droplets 70, furthermore it is needed to pay attention to various other points described below:

At first, if the solid substance included in the droplet is a fine particle, the size of the particle is preferably small. The smaller the size of the particle is, the more easily the particle tends to get transferred by the convection. As a result, precipitation of the solid substance at the end section of the higher temperature side of the droplet is restrained. Accordingly, de-pinning operation is caused easily at the end section of the higher temperature side of the droplet.

Furthermore, the solid substance concentration is preferably low. The lower the solid substance concentration is, the more easily the precipitation of the solid substance at the end section of the higher temperature side of the droplet is restrained. Accordingly, de-pinning operation is caused easily at the end section of the higher temperature side of the droplet.

Moreover, adhering speed and adhesive force between the solid substance and the substrate are preferably less. This is because the less the adhering speed and adhesive force are, the more unlikely pinning operation is caused at the end section of the higher temperature side of the droplet, and then, de-pinning operation is easily caused there. Furthermore, it is possible in the course of de-pinning operation to prevent any solid substance from depositing on the substrate as a residue.

In order to lessen the adhesive force between the solid substance and the substrate, it is recommended to increase the thickness of a protection layer on the fine particle surface. If the solid substance is a fine particle, a protection layer made of an organic substance and so on is placed on the fine particle surface for the purpose of preventing collective cohesion of the fine particle to be given in plural numbers. This is because, if the protection layer is thicker, adhesion between the fine particle and the substrate can also be prevented.

Furthermore, by electrifying the solid substance and the substrate 48 with the same electric charge, it becomes possible to lessen the adhesive force between the two. Generally, fine particles are electrified to be negative, and therefore, it is recommended to electrify the substrate 48 to be also negative. In order to electrify the substrate 48, it is preferable to make use of a self assembled mono-layer film (SAM film). Here, a silane coupling agent, which can be represented as $R_n$—Si—$(O-Et)_{4-n}$, is adopted as a self assembled mono-layer film. Since the ethyl group adheres to the substrate 48, a monomolecular film is formed on the substrate 48. Then, if a carbo-xyl group (—$COO^-$) is used for the "R" section, the surface of the substrate 48 can be electrified to be negative. Contrarily, if the fine particle is electrified to be positive, it is recommended to use an amino group (—$NH_3^+$) for the "R" section in order to electrify the substrate surface to be positive.

Meanwhile, it is preferable that the boiling point of the dispersion solvent or any other solvent material included in the droplet is high enough. If the boiling point of the dispersion solvent or such a solvent material is low, the droplet get dried before Marangoni convection appears by a compulsory temperature gradient, and there is a chance that pinning operation is possibly caused at the end section of the higher temperature side of the droplet.

Furthermore, it is preferable that the thermal conductivity of the dispersion solvent or such a solvent material is high enough. This is because the higher the thermal conductivity of the dispersion solvent or such a solvent material is, the more easily a temperature gradient can be given to the droplet surface. Still further, it is preferable to use a dispersion solvent or any other solvent material whose surface tension is greatly dependent on temperature. The more dependent to temperature the surface tension is, the more easily a difference in the surface tension is caused according to a temperature gradient on the droplet surface and Marangoni convection is generated as required. This is because eventually de-pinning operation is likely to come up at the end section of the higher temperature side of the droplet.

Moreover, it is preferable that the viscosity of the dispersion solvent or such a solvent material is low enough. This is because; if the viscosity of the dispersion solvent or such a solvent material is high, it becomes difficult to cause Marangoni convection and there is a chance that pinning operation is possibly caused at the end section of the higher temperature side of the droplet. Incidentally, in order for the droplet ejection device to eject the liquid material steadily, the viscosity of the liquid material is set to be in the range from 0.1 to 30 cps approximately. Therefore, regarding any droplet formed by ejection out of the droplet ejection device, there is no problem for causing Marangoni convection.

Meanwhile, it is preferable that the substrate surface is uniformly finished. If the substrate surface is in uniform condition, the end section of the higher temperature side of the droplet gets contracted so uniformly that pinning operation is unlikely to be caused at the end section of the higher temperature side but pinning operation is likely to be caused there instead. Furthermore, if the substrate surface is in uniform condition, any solid substance included in the droplet is unlikely to deposit on the substrate as a residue in the course of de-pinning operation. Moreover, any accepting type substrate is not preferable.

Figure 6A:
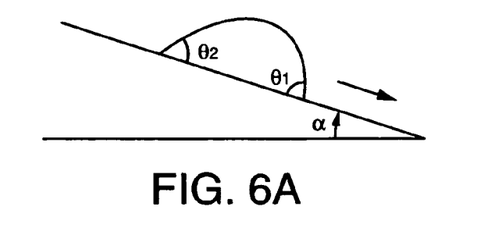
FIG. 6 shows drawings to explain a receding contact angle of a droplet.

Furthermore, it is preferable to set an appropriate receding contact angle between the substrate and the droplet. FIG. 6A is a drawing for explaining a receding contact angle of a droplet. A receding contact angle is called dynamic contact angle, and known measuring methods on the contact angle are; Wilhelmi method, Expansion/Contraction method, Downfall method, and so on. Among those methods, Downfall method carries out measurement; in which a droplet is formed on a solid test piece as FIG. 6A shows, and then, the contact angles are measured at the time when the droplet moves while the solid test piece being tilted. Under the condition, the contact angle $\theta 1$ positioned at the front side in the direction of the liquid material's motion is the advancing contact angle, while the other contact angle $\theta 2$ positioned at the rear side is the receding contact angle.

Figure 6B:
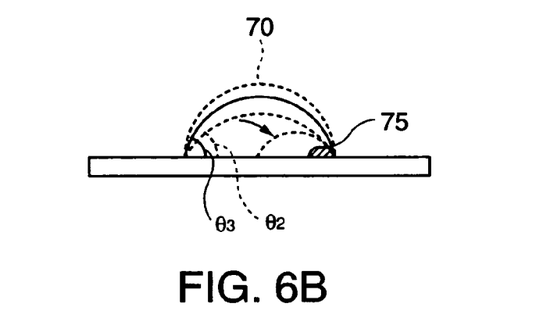

As FIG. 6B shows, each droplet starts to vaporize as soon as it gets ejected. Then, if once a solid substance gets precipitated at the end section of the lower temperature side of the droplet, the end section of the droplet becomes as if it is pinned with the precipitated solid substance so that contraction of the droplet to be caused by subsequent drying is restrained. However, if the droplet starts to contract before precipitation of the solid substance, there may be a chance of making it difficult to form a dry film at a position as specified.

Then, it is preferable to set the receding contact angle between the droplet and the substrate, $\theta 2$, to be smaller than the angle caused by the end section of the droplet and the substrate at the time when the solid substance gets precipitated at the end section of the lower temperature side of the droplet, $\theta 3$. Under the condition, before the solid substance gets precipitated at the end section of the lower temperature side of the droplet, the angle caused by the end section of the droplet and the substrate is greater than the receding contact angle $\theta 2$, and therefore, there is no chance that the end section of the lower temperature side of the droplet does contract. Then, after the solid substance gets precipitated at the end section of the lower temperature side of the droplet, the end section of the droplet becomes as if it is pinned with the precipitated solid substance so that contraction of the droplet to be caused by subsequent drying is restrained. Consequently, it becomes possible to precipitate the solid substance at a position as required so that a highly accurate dry film can be formed at the position as required.

The receding contact angle between the droplet and the substrate can be adjusted by treating the substrate surface with a self assembled mono-layer film (SAM film). As a self assembled mono-layer film, for example, C18 (Octa-decyltrimethoxy-silane) and so on can be adopted. Then, if C18 molecules are packed most densely onto the substrate surface, it becomes easier for the droplet to move on the surface, and eventually the receding contact angle becomes greater. Therefore, by setting the C18 molecular density on the substrate surface to be low, the receding contact angle can be reduced.

Incidentally, reducing the receding contact angle is also preferable for the purpose of preventing any bulge from coming up in the course of drying operation of the droplet. That is to say, when a droplet contracts like a ball due to effect of surface tension, normally the contraction can be restrained by pinning. However, in this embodiment, de-pinning operation is caused at the end section of the higher temperature side of the droplet, and accordingly, there are not enough countermeasures to restrain any bulge from coming up in the course of drying operation of the droplet. Therefore, the prevention against such a bulge by measures described above is preferable.

Meanwhile, it is preferable that the temperature of circumstances around the droplet is low. The reason is, if the temperature of circumstances is high, drying operation of the droplet is promoted and the end section of the droplet gets a high concentration before effect of the convection emerges so that pinning operation is likely to get caused at the end section of the higher temperature side.

Furthermore, it is preferable that only a short period is given between ejecting the droplet and providing the compulsory temperature gradient. This is because, if the interval between the process steps is long, drying operation of the droplet progresses and there is a chance that pinning operation is caused at the end section of the higher temperature side of the droplet.

By the way, the reason why a droplet on a substrate usually causes pinning is that the droplet gets dried quickly at its circumferential area (edge) so that the solid substance concentration reaches its saturation point at the end section at first. Therefore, in order to restrain pinning operation and cause de-pinning instead, it is recommended to reduce drying speed of the droplet and restrain vaporization at the end section of the droplet.

Drying speed of a droplet changes according to various factors, such as an interval between one droplet and another placed on the substrate (droplet-to-droplet distance), layout of a plurality of droplets, timing of placement, motion speed of a stage on which the substrate is mounted, contact angles between the liquid material and the substrate surface, and so on.

When a droplet gets dried, vapor coming from a liquid phase to a gas phase diffuses into a 3-D space while having its diffusing center at the droplet to create a diffusion sphere of vapor. When a plurality of droplets are placed on a substrate and a first droplet is located in a second droplet's diffusion sphere of vapor, the vapor concentration at the surface of the first droplet becomes higher because of effect of the second droplet's diffusion sphere of vapor so as to reduce drying speed of the first droplet. Here, the shorter the interval between droplets and the more the diffusion areas of vapor are overlapped, the more the vaporizing speed (i.e., drying speed) of the droplets is reduced to extend the drying time.

Moreover, if any other droplets are placed only on the same side in comparison with the first droplet, drying speed of the first droplet gets reduced in the direction toward the side because effect of the other droplets' spheres of vapor works in the direction from the side. In other words, drying speed changes according to layout of the droplets. Furthermore, if there exists long duration after placement of any other droplets until placement of the first droplet, effect of the other droplets' spheres of vapor is lessened and drying speed of the first droplet is unlikely to get reduced. In other words, the shorter the time interval between placement of a droplet and that of another is, the more the drying speed of the droplets is reduced.

Still further, if a stage, on which the substrate is mounted, is transferred, vapor concentration in the gaseous circumstance around the droplets is reduced and drying operation of the droplets is promoted. Namely, if the stage, on which the substrate is mounted, is not transferred, drying speed of the droplets is reduced.

Figure 4C:
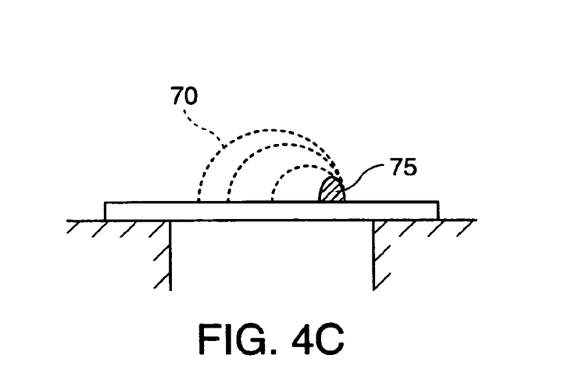

Based on the concepts described above, pinning operation is caused at the end section of the lower temperature side of the linear droplets 70, while de-pinning operation is also done at the end section of the higher temperature side, as FIG. 4C shows. Accordingly, the solid substance gets precipitated locally at the end section of the lower temperature side, and contraction of the droplet to be caused by subsequent drying is restrained. On the other hand, at the end section of the higher temperature side of the droplet, the droplet gets contracted without precipitation of the solid substance as drying operation progresses. Then, as a result of completion of the droplet drying operation, the dry film 75 is formed along the end section of the lower temperature side of the linear droplets 70 as FIG. 1C shows.

Furthermore, as already described above, the surface of the fine particle, which is one of the constituent materials for the dry film 75, is covered with a protection layer for the purpose of preventing collective cohesion of the fine particle to be given in plural numbers. Therefore, if once thermal treatment (annealing) is carried out on the formed dry film 75 to dissolve the protection layer, the fine particles cohere each other to make up and bake electrical wiring. Incidentally, since the droplet 70 is ejected to become linear, the straight part 75*a* is formed at the center area of the dry film 75. Then, in the case where only the straight part 75*a* is used for electrical wiring, it is recommended to carry out thermal treatment only on the straight part 75*a* to make the fine particles cohere each other, and disperse the other part into a dispersion solvent and so on to remove it.

Figure 7A:
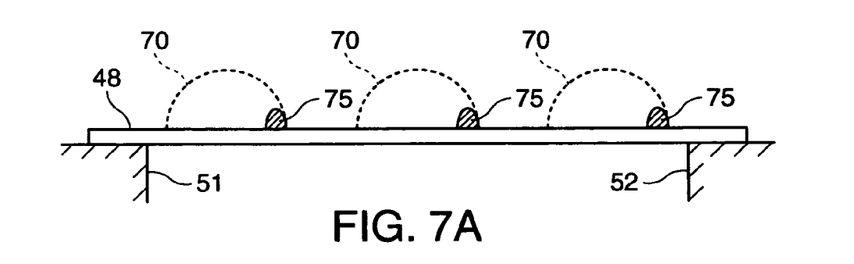
FIG. 7 shows drawings to explain a case where multiple droplets are processed collectively.

FIG. 7A is a drawing for explaining a case where pluralities of droplets are collectively processed in the same process step. In the case that the paragraphs up to here have described, one linear droplet is formed and provided with a temperature gradient to form one dry film. However, it is also possible to collectively provide a plurality of linear droplets 70 with a temperature gradient in order to form a plurality of dry films 75 at the same time. Here, the plurality of linear droplets 70 are formed in parallel on the substrate 48 at first. Next, the substrate 48 is laid between the hot plate 51 and the cooling plate 52 so as to place all the linear droplets 70 between the above two components. Then, the surfaces of all the droplets 70 placed between the hot plate 51 and the cooling plate 52 are collectively provided with the same temperature gradient. By the way, a group of the droplets of the side of the hot plate 51 and that of the side of the cooling plate 52 are in different temperature ranges. However, by simply providing each droplet surface with only a temperature gradient, a surface tension distribution is caused, and then Marangoni convection can be generated in each of all the droplets 70. As a result, the dry film 75, being the same as described above, is formed with each of the droplets 70, and eventually a plurality of electrical wirings can be obtained at the same time. Furthermore, since each of the droplets 70 is provided with the same temperature gradient, each dry film 75 can be formed to be the same.

Figure 7B:
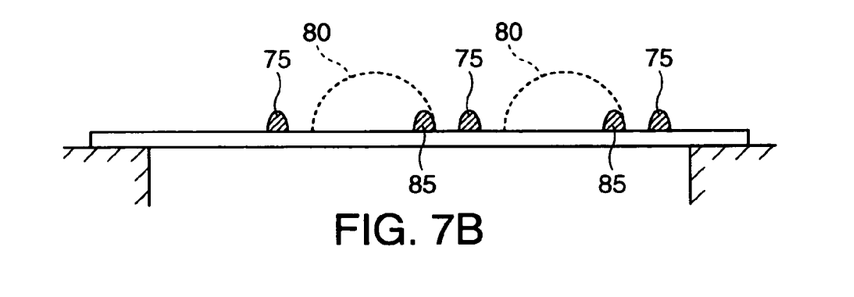

FIG. 7B is a drawing for explaining a case where a dry film is additionally formed to be adjacent to another dry film that is already formed beforehand. As described above, by forming an additional dry film to be adjacent to another dry film already formed beforehand, it becomes possible to make electrical wirings and so on with a short pitch. Here, a second droplet 80 is placed to be adjacent to the first dry film 75 already formed beforehand, and a second dry film 85 is formed at the end section of the lower temperature side of the second droplet 80. Furthermore, it is preferable to place the second droplet 80 after carrying out thermal treatment for the first dry film 75 already formed beforehand to cohere the fine particle. Through those process steps described above, it is possible to prevent the first dry film 75 from getting dispersed again by the second droplet 80.

In this exemplary embodiment, a line width of the dry film 75 is dependent on the concentration of the solid substance included in the droplet. By decreasing the concentration, the line width can easily be thinned.

Moreover, in this exemplary embodiment, explanation is given on a case where a droplet is formed to be linear in order to obtain a dry film having a straight part. However, by setting an optional droplet shape as required, it is possible to obtain a dry film provided with a required pattern. For example, if a droplet is formed to be like a dot (hemisphere), it is also possible to obtain a crescent-shaped dry film.

Furthermore, in this exemplary embodiment, explanation is given on a case for forming an electrical wiring. However, by using the method of this embodiment of forming a film, it is also possible to form a photo-mask pattern, a channel part of an organic TFT, and so on.

As described above in detail, the method of this embodiment of forming a film has a structure, where a compulsory temperature gradient is given onto surfaces of linear droplets in order to cause Marangoni convection, which causes pinning operation at the end section of the lower temperature side of the linear droplets as well as de-pinning operation at the end section of the higher temperature side so that a dry film is formed only at the end section of the lower temperature side. By using the method, it becomes possible to form a dry film that is finer than the droplet size. Accordingly, the formed dry film can be used as a highly accurate electrical wiring. For example, it is still possible to form a highly accurate electrical wiring provided with its line width in the range of 0.5 to 1.0 microns approximately, and then electrical wirings in compliance with a next-generation design rule can be provided.

From the viewpoint described above, if a sub-micron size droplet is formed by using a femto-liter inkjet unit, a sub-micron size dry film can eventually be formed. However, it takes a rather long time to draw a pattern with a sub-micron size droplet. On the other hand, the method of this embodiment of forming a film makes it possible to draw a pattern at usual speed by using an ordinary inkjet unit that ejects pico-liter size droplets. Here, it is possible to draw a pattern 10 times faster than the method by using a femto-liter inkjet unit. Consequently, production costs as well as manufacturing time can be reduced.

The method of this exemplary embodiment of forming a film makes it possible to form a dry film as specified by simply providing a droplet surface with only a temperature gradient, regardless of the position of the temperature gradient region. Thus, the method can make a contribution to lightening the workload to be caused by thermal treatment on the substrate and base layer. For example, in the case where electric wiring is formed on a plastic substrate, the required electric wiring can be formed by providing the droplet surface with a temperature gradient of a low-temperature region, without changing the quality of the plastic substrate.

Each of the droplets described above is formed by ejecting a liquid material from a droplet ejection device. Then, the droplet ejection device is explained below by referring to FIG. 8, which shows a bird's-eye view of the droplet ejection device. A droplet ejection device 10 can be mainly composed of a base 12, a first transfer unit 14, a second transfer unit 16, an electronic balance (not illustrated in the drawing) as a weighing means, a head 20, a capping unit 22, and a cleaning unit 24. Operation of the droplet ejection device 10, which includes the first transfer unit 14 and the second transfer unit 16, is controlled by a control unit 23. By the way, in FIG. 8, the X-axis direction is a side-to-side direction of the base 12, the Y-axis direction is a back-and-forth direction of the same as above, and the Z-axis direction is a vertical direction of the same as above.

Figure 8:
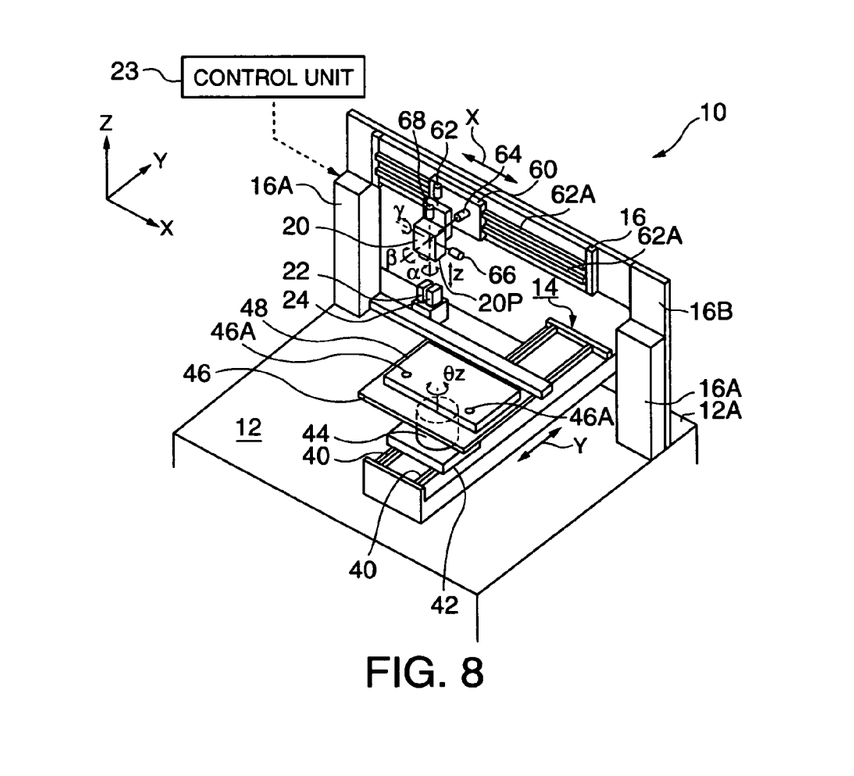
FIG. 8 is a drawing to show a bird's eye view of a droplet ejection device.

The first transfer unit 14 is directly mounted on a top surface of the base 12, while a couple of guide rails 40 being aligned with the Y-axis direction. The first transfer unit 14 is equipped with a slider 42, which can move along the couple of the guide rails 40. As a means for driving the slider 42, a linear motor can be adopted, for example. By the driving means, the slider 42 becomes able to move along the Y-axis direction and also becomes able to stop at any location as required for positioning.

A motor 44 is installed onto a top surface of the slider 42, and a table 46 is fixed to a rotor of the motor 44. The table 46 positions the substrate 48, while holding it. That is to say, by operating a hold-chucking device that is not illustrated in the drawing, the substrate 48 is chucked through a hole 46A of the table 46 so that the substrate 48 can be held on the table 46. Furthermore, the motor 44 is a direct drive motor, for example. When the motor 44 is energized, the table 46 turns together with the rotor in the θz direction and then it can index the table 46 (radial indexing). Moreover, the table 46 is equipped with a spare ejection area that is used for the head 20 to implement rehearsal ejection or ejection trial (test ejection).

Meanwhile, a couple of supporting columns 16A are built in the rear section of the base 12, and a column 16B is constructed at the upper part of the supporting columns 16A. Then the second transfer unit 16 is placed on a front surface section of the column 16B, which is equipped with a couple of guide rails 62A placed along the X-axis direction and a slider 60 that can move along the guide rails 62A. As a device for driving the slider 60, a linear motor can be adopted, for example. By the driving device, the slider 60 becomes able to move along the X-axis direction and also becomes able to stop at any location as required for positioning.

The slider 60 is equipped with the head 20, which is connected to some motors; i.e., 62, 64, 66 and 68 that work as swinging and positioning devices. The motor 62 makes it possible for the head 20 to move in the Z-axis direction and stop at any location as required for positioning. The motor 64 enables the head 20 to swing in the β direction around the Y-axis and stop at any location as required for positioning. The motor 66 makes it possible for the head 20 to swing in the γ direction around the X-axis and stop at any location as required for positioning. The motor 68 enables the head 20 to swing in the α direction around the Z-axis and stop at any location as required for positioning.

As described above, the substrate 48 is able to move and position itself in the Y-axis direction, and to swing and position itself in the θz direction. Meanwhile, the head 20 is able to move and position itself in the X-axis direction and Z-axis direction, and to swing and position itself in the α direction, the β direction, and the γ direction. Therefore, in the droplet ejection device 10 of this exemplary embodiment, it is possible to accurately control the relative position and pose between an ink ejecting surface 20P of the head 20 and the substrate 48 placed on the table 46.

Figure 9:
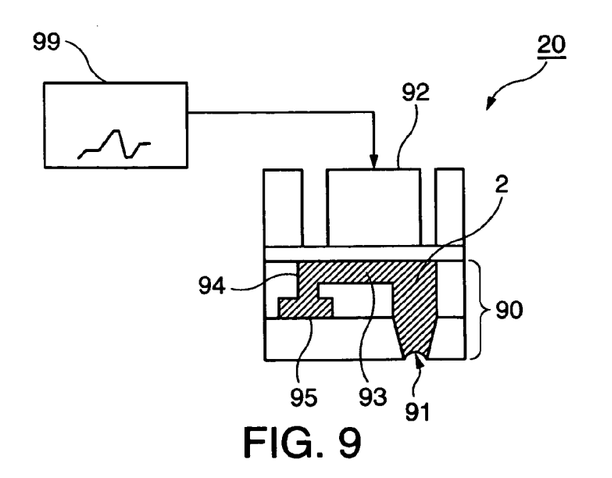
FIG. 9 is a side view drawing of an inkjet unit head in its section.

In this paragraph, a structure sample for the head 20 is described by referring to FIG. 9, which shows a side view in section of the inkjet head. The head 20 ejects a liquid material 2 from a nozzle 91 by a droplet ejection method. As a droplet ejection method, various technologies can be applied, such as the piezo method, in which the liquid material is ejected by using a piezo element as a piezoelectric component, another method, in which the liquid material is ejected by heating the liquid material and generating bubbles (foam), and so on. Among those technologies, the piezo method has an advantage that no heat is added to the liquid material and eventually the liquid material composition and so forth is not negatively affected. Therefore, the piezo method described above is adopted for the head 20 shown in FIG. 9.

In a head main body 90 of the head 20, a reservoir 95 and a plurality of ink cells 93 branched from the reservoir 95 are prepared. The reservoir 95 works as a flow path to supply the liquid material 2 to each of the ink cells 93. Furthermore, a nozzle plate making up the ink ejecting surface is installed at the bottom surface of the head main body 90. In the nozzle plate, a plurality of nozzles 91, which eject the liquid material 2, open their ports corresponding each of the ink cells 93. Then, an ink flow path is formed from each of the ink cells 93 to its corresponding nozzle 91. Meanwhile, a vibrating plate 94 is mounted at the top surface of the head main body 90. Furthermore, the vibrating plate 94 makes up a wall for each of the ink cells 93. Outside the vibrating plate 94, a piezo element 92 corresponding to each of the ink cells 93 is placed. The piezo element 92 is made up by sandwiching a piezoelectric material such as crystal and so on between a couple of electrodes (not illustrated in the drawing), which are connected to a driver circuit 99.

Then, by applying a voltage to the piezo element 92 from the driver circuit 99, the piezo element 92 gets expansion deformation or contraction deformation. If the piezo element 92 gets contraction deformation, pressure of the corresponding ink cell 93 becomes decreased to have the liquid material 2 flow into the ink cell 93 from the reservoir 95. Contrarily, if the piezo element 92 gets expansion deformation, pressure of the corresponding ink cell 93 becomes increased to eject the liquid material 2 out of the corresponding nozzle 91. Furthermore, by changing the voltage to be applied, it becomes possible to control the amount of deformation of the piezo element 92. Still further, by changing the frequency of the voltage to be applied, it becomes possible to control the speed of deformation of the piezo element 92. That is to say, controlling the voltage to be applied to the piezo element 92 makes it possible to control ejecting condition of the liquid material 2.

Meanwhile, the droplet ejection device shown by FIG. 8 is equipped with a capping unit 22 and a cleaning unit 24. The capping unit 22 is used to cap the ink ejecting surface 20P when the droplet ejection device 10 is in stand-by condition, for the purpose of preventing the ink ejecting surface 20P of the head 20 from getting dried. Furthermore, the cleaning unit 24 is used to vacuum up the inside part of the nozzles in order to remove clogging of any nozzle of the head 20. The cleaning unit 24 is also able to wipe the ink ejecting surface 20P for the purpose of remove any stain on the ink ejecting surface 20P of the head 20.

Figure 10:
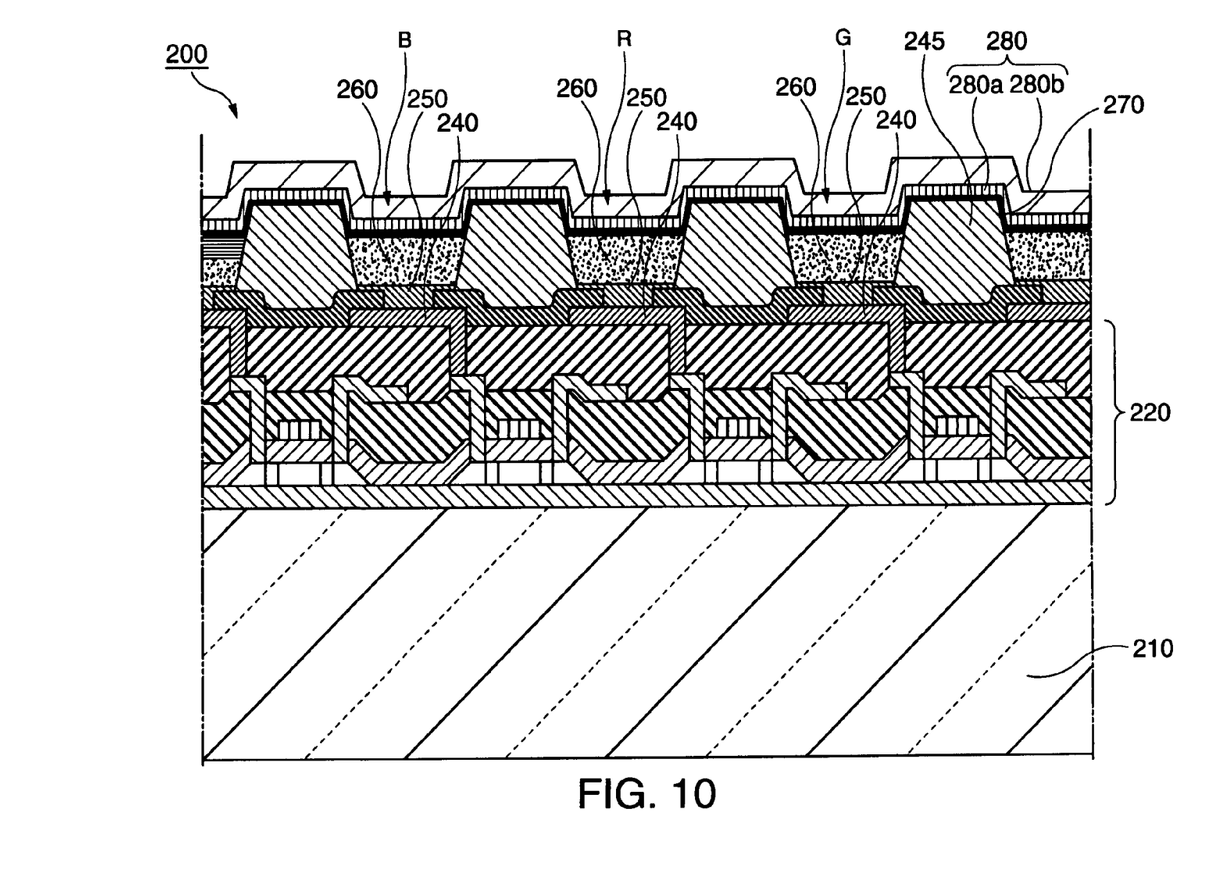
FIG. 10 is a side view drawing of an organic electroluminescent device in its section.

Next, an organic electroluminescent device as an example of an electro-optical apparatus manufactured by using the method of this exemplary embodiment of forming a film is explained by referring to FIG. 10.

An organic electroluminescent device 200 is equipped with a plurality of pixel areas R, G and B that are arranged in matrix condition. A circuit part 220 for driving each of the pixel areas is formed on a surface of a substrate 210, and a plurality of pixel electrodes 240 are formed in matrix condition on a surface of the circuit part 220. Furthermore, a bank 245 made of an electrical insulating material is formed in an area surrounding each of the pixel electrodes 240. On a surface of each of the pixel electrodes 240, which works as an anode, a hole injection layer 250 and a luminous layer 260 are formed in due order. Still further, for all over the surfaces of the luminous layer 260 and the bank 245; an electron injection layer 270 and a common cathode 280 are formed. Moreover, a sealing substrate (not illustrated in the drawing) is pasted and placed onto an edge part of the substrate 210 for the purpose of sealing the entire device.

Then, by using the method of this exemplary embodiment of forming a film, each of the functional layers, which the organic electroluminescent device 200 described above is composed of, can be formed. Furthermore, each electrical wiring included in the circuit part 220 can be formed. Thus, by furnishing highly accurate functional layers as well as electrical wiring, an organic electroluminescent device that is downsized and excellent in displaying quality can be provided.

Figure 11:
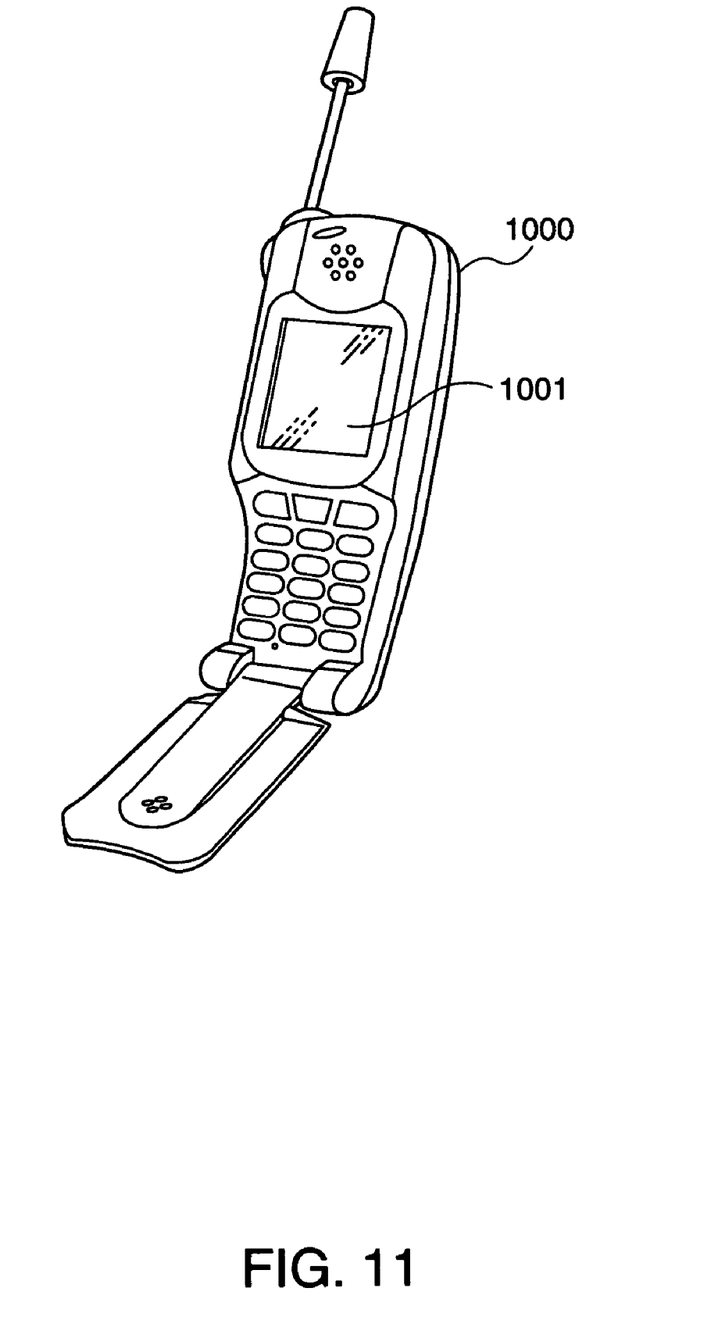
FIG. 11 is a drawing to show a bird's eye view of a cellular phone.

Next, electronic equipment made by using the method of this exemplary embodiment of forming a film is explained by referring to FIG. 11, which shows a bird's-eye view of a cellular phone. In FIG. 11, a reference numeral 1000 is a cellular phone main body, and a reference numeral 1001 represents a display section. The cellular phone 1000 is equipped with the display section 1001 formed by using the method of this embodiment of forming a film. Therefore, it is possible to inexpensively provide the cellular phone 1000 that is downsized and excellent in displaying quality.

By the way, it should be understood that the technical scope of the invention is not confined to this exemplary embodiment described above, but also includes what are materialized by adding various modifications to this embodiment described above as far as they do not deviate from the concept of the present invention. In other words, the materials, the structures, and so on concretely mentioned in this exemplary embodiment are just for example, and they can be modified appropriately as required. A case, in which a dispersion solvent prepared by dispersing a dispersion substance in a dispersion solvent is used for forming a film, is described above for example. However, the invention can also be adopted for another case in which a solution prepared by dissolving a substance in a solvent is used for forming a film. Furthermore, a case, in which an electric wiring pattern is formed, is described above as a sample case, but the invention can also be adopted for forming any other pattern.

An experiment, in which a fine wiring is formed while the contact angle between a droplet and a substrate being changed, has been carried out as described below.

A dispersion substance, Ag colloid ink (particle size=some nano-meters), is dispersed into a dispersion solvent, tetradecane (boiling point: about 254 degrees Celsius), with 0.05 vol. percent concentration for making up a liquid material for ejection.

Meanwhile, multiple kinds of substrates, each of which has a different contact angle, are prepared by carrying out surface treatment on each Si substrate surface with a different type of SAMs. For a first substrate, surface treatment is done with FAS17 (1H,1H,2H,2H-perfluoro-decyltriethoxy-silane) and then, ultraviolet rays are applied for 90 seconds to get the static contact angle of 39.7 degrees against the liquid material described above. A surface of a second substrate is treated with C18 (Octa-decyltrimethoxy-silane) to get the static contact angle of 34 degrees against the liquid material described above. A surface of a third substrate is treated with FT007 (C18 being packed most densely) to get the static contact angle of 34 degrees against the liquid material described above. Incidentally, a receding contact angle of the third substrate is greater than that of the second substrate.

The liquid material described above is ejected onto each substrate by using a droplet ejection device. Here, a droplet volume of the liquid is 10 pico-liter per one dot (the diameter that each droplet initially has just after its ejection is from 50 to 55 microns) and a dot pitch is from 45 to 55 microns, while 100 dots are ejected in 10 columns.

Then, being immediately after droplet ejection on it, the substrate is bridged between a hot plate and a cooling plate that are laid with a clearance of about 1 cm between the two. At the time of placement, the substrate orientation is adjusted so that a temperature gradient is given to be perpendicular to the longitudinal direction of each linear droplet. Temperature of the hot plate and the cooling plate is 50 degrees and 5 degrees, respectively. The substrate is kept as it is for a while in order to dry the droplets, and then after the drying operation, condition of the formed dry film is checked by using a microscope.

As a result, on the first substrate and the second substrate, a fine wiring having its line width of 0.5 to 1.0 micron is formed at the end section of the lower temperature side of the linear droplets. However, in the case of the first substrate provided with a static contact angle of 39.7 degrees, the most uniform and fine wiring is formed. Regarding the second substrate and the third substrate provided with the same static contact angle, the third substrate having a greater receding angle shows a result that the droplet gets bulges and eventually any fine and uniform wiring cannot be obtained.

In addition to the SAMs described above, substrates provided with surface treatment by using other materials, i.e., FAS17 (without application of ultraviolet rays), FAS3 (3,3,3 trifluoro-propylethoxy-silane), Bz (benzyl-triethoxy-silane), Cn (3-cyano-propylethoxy-silane), NH2 (3-amino-propyltrimethoxy-silane), and C8 (octyl-trichloro-silane), have been made and experimented. The substrate treated with FAS17 but without application of ultraviolet rays shows a result that the contact angle is large and bulges are caused in the droplet so that any linear thin film cannot be obtained. In any other case using the other SAMs, the contact angle is small and the material of SAMs gets spread in wet condition so that no convection is caused effectively and it is impossible to gather a dry film at one side of the droplet.

What is claimed is:

1. A method of forming a film, comprising:
    forming linear droplets by placing a plurality of droplets onto a substrate, the droplets each having two end sections which are opposite from each other in plan view;
    providing surfaces of the linear droplets with a substantially uniform temperature gradient such that at least one solid substance in the linear droplets precipitates substantially at one of the end sections, the temperature gradient created by laying the substrate between a first heat supply section that provides one end section of the linear droplets with a first temperature and a second heat supply section that provides the other end section of the linear droplets with a second temperature, the second temperature being different from the first temperature; and
    forming a film pattern where the at least one solid substance substantially precipitates within each of the linear droplets.

2. The method of forming a film according to claim 1, the film pattern being formed at the end section that has a lower temperature of the linear droplets.

3. The method of forming a film according to claim 1, surfaces of the linear droplets being provided with the temperature gradient by applying light rays to one end section of the linear droplets in a widthwise direction.

4. The method of forming a film according to claim 1, a static contact angle between the substrate, on which the linear droplets are formed, and the linear droplets being in a range from 20 degrees to 50 degrees.

5. The method of forming a film according to claim 1, a receding contact angle between the substrate, on which the linear droplets are formed, and the droplets being set to be less than an angle caused by an end section of the droplets and the substrate at a time when a solid substance included in the droplets is precipitated at an end section of the droplets.

6. The method of forming a film according to claim 1, the linear droplets that are formed in plural numbers and surfaces of the plurality of the linear droplets being provided with a temperature gradient in order to form a film pattern at each of the end sections with a lower temperature of the plurality of the linear droplets collectively.

7. A method of manufacturing a device, comprising:
    forming a film according to the method of claim 1, the film being an element of the device.

8. An electro-optical apparatus, comprising:
    a device manufactured according to the method of claim 7.

9. A method of forming a film, comprising:
    forming linear droplets by placing a plurality of droplets onto a substrate, the linear droplets each having two end sections which are opposite from each other in plan view, the linear droplets including a solid substance,
    providing surfaces of the linear droplets with a substantially uniform temperature gradient such that the solid substance precipitates substantially at one of the end sections, the temperature gradient created by laying the substrate between a first heat supply section that provides one end section of the linear droplets with a first temperature and a second heat supply section that provides the other end section of the linear droplets with a second temperature, the second temperature being different from the first temperature,
    forming a film pattern where the solid substance substantially precipitates within each of the linear droplets, and
    electrifying the solid substance of the linear droplets and the substrate with the same electric charge.

* * * * *